(12) United States Patent
Stephen et al.

(10) Patent No.: US 6,894,475 B2
(45) Date of Patent: May 17, 2005

(54) SCANNING RF RECEIVER

(75) Inventors: Andrew Barry Stephen, Spinney Hill (GB); Steven J. Holmes, Oadby (GB); Keith Raymond Fuller, Irchester (GB)

(73) Assignee: Audiotel International Ltd., Weldon (GB)

( * ) Notice: Subject to any disclaimer, the term of this patent is extended or adjusted under 35 U.S.C. 154(b) by 77 days.

(21) Appl. No.: 10/275,186

(22) PCT Filed: Apr. 25, 2001

(86) PCT No.: PCT/GB01/01845
§ 371 (c)(1),
(2), (4) Date: Feb. 6, 2003

(87) PCT Pub. No.: WO01/86810
PCT Pub. Date: Nov. 15, 2001

(65) Prior Publication Data
US 2004/0212358 A1 Oct. 28, 2004

(30) Foreign Application Priority Data
May 5, 2000 (GB) .............................................. 0010841

(51) Int. Cl.[7] .............................................. G01R 23/16
(52) U.S. Cl. ................................. 324/76.26; 324/76.11
(58) Field of Search .......................... 324/76.11, 76.19, 324/76.26, 76.27, 609, 613, 620, 623, 760, 765; 455/313–315, 130, 154.2, 161.1

(56) References Cited

U.S. PATENT DOCUMENTS

| 3,366,877 | A |   | 1/1968  | Kinkel et al. ................. 324/77 |
| 3,783,388 | A |   | 1/1974  | Disinger ...................... 325/363 |
| 3,984,769 | A |   | 10/1976 | Williams et al. .............. 324/77 |
| 4,340,975 | A | * | 7/1982  | Onishi et al. ................ 455/315 |
| 4,368,539 | A |   | 1/1983  | Whidden ..................... 455/166 |
| 4,501,020 | A |   | 2/1985  | Wakeman .................... 455/226 |
| 6,002,924 | A | * | 12/1999 | Takano ...................... 455/161.1 |
| 6,057,765 | A |   | 5/2000  | Jones et al. ................ 340/572.2 |
| 6,163,259 | A |   | 12/2000 | Barsumian et al. ........ 340/572.2 |

FOREIGN PATENT DOCUMENTS

| WO | WO 96/12199    | 4/1996  | ............. G01S/5/00 |
| WO | WO 01/86810 A1 | 11/2001 | ............. H03J/7/32 |

* cited by examiner

*Primary Examiner*—Vincent Q. Nguyen
(74) *Attorney, Agent, or Firm*—Bromberg & Sunstein LLP

(57) ABSTRACT

A receiver for analyzing input RF signals includes a first stage that includes an input for receiving one or more RF signals for analysis and a first local oscillator having an output including a first plurality of frequencies. The input is mixed with the local oscillator output in a first mixer to generate a first intermediate frequency spectrum output. A second stage includes a second local oscillator adapted to produce as output a sweep signal traversing a second plurality of frequencies and a second mixer for combining the second local oscillator output with the first intermediate frequency output to generate a second intermediate frequency output.

20 Claims, 10 Drawing Sheets

SCANNING RF RECEIVER

The present invention relates to receivers adapted for rapid scanning or "sweeping" of the radio-frequency spectrum, for example, receivers or spectrum analysers used in the detection and location of unknown sources of electromagnetic radiation. Such receivers are often used in counter-surveillance activities for the location of bugging devices, but have other varied applications, such as EMC emissions testing.

Harmonic reception is often used in counter-surveillance since the technique allows numerous frequencies to be simultaneously interrogated for RF signals, thus reducing the time required to perform counter-surveillance sweeps. An important feature of any counter-surveillance receiver is the ability to quickly and accurately detect signals at numerous different frequencies in the radio-frequency spectrum, and convey information about the spectrum to a user, either visually or aurally. In the prior art, harmonic receivers have, for example, used a technique known as "swept compression" for performing scans of the spectrum. While this method is perfectly adequate for "fingerprinting" a particular RF spectrum, analysing signals captured using this method can become a non-trivial task.

In order to better understand the harmonic receiver principle, the operation of a conventional superheterodyne receiver is first discussed. In a conventional superheterodyne receiver, a local oscillator (LO) signal and an incoming RF signal are applied to a mixer in order to convert the incoming RF signal to an intermediate frequency (IF). A typical superheterodyne receiver topology is shown in FIG. 1.

With reference to FIG. 1, the conventional superheterodyne receiver 1 comprises an antenna 2 for receiving input RF signals. These input signals are fed to an RF image filter 3 adapted to pass only the frequency or frequencies of interest. In particular, the filter 3 is normally a bandpass filter adapted to remove an image frequency, discussed later. The output signal from image filter 3 is fed to an amplification stage 4, and then to a further filtration stage 5 to pre-process the RF signal prior to mixing. This pre-processed signal is combined with a signal of frequency $F_{LO}$, from a local oscillator 6, in mixer 7, to generate an intermediate frequency $F_{IF}$ signal which is applied to a intermediate frequency filter 8.

In general, a response will be seen at the output of the IF filter 8 when the RF input signal $F_{RF}$ conforms to the relationship $$F_{RF} = n \times F_{LO} \pm F_{IF} \quad (1)$$

where $F_{RF}$ is the RF input frequency, $F_{LO}$ is the local oscillator frequency, n is the local oscillator harmonic order (n=1, 2 ... ∞) and $F_{IF}$ is the receiver intermediate frequency. For the ideal superheterodyne receiver 1 considered here, the local oscillator 6 harmonic order equals 1.

The sensitivity of the conventional superheterodyne receiver 1 is given by the relationship $$P_{sens(dBm)} = -174 + 10\log_{10}(IF_{BW}) + F + CNR \quad (2)$$

where -174 is the thermal noise measured in a 1 Hz bandwidth (dBm), $IF_{BW}$ is the final pre-detection bandwidth (Hz), F is the noise figure of the receiver (dB) and CNR is the required carrier to noise ratio for the desired receiver response (dB). The relationship given in (2) only considers internal receiver noise.

From relationship (1), it can be seen that two RF signals will be converted to the IF; these signals are generally known as the wanted response and unwanted/image response. In the conventional superheterodyne receiver 1, the RF image filters 3 and 5 are employed to remove the unwanted response prior to the mixing process. If the RF image filters 3, 5 were omitted, the sensitivity given in relationship (2) could actually be 3 dB worse due to noise at the image frequency being converted to the IF.

The input frequency plan 20 for the conventional superheterodyne receiver 1 is shown in FIG. 2. It will be noted that the wanted signal $F_{RF}$ 21 (of bandwidth $IF_{BW}$) and the unwanted (image) signal $F_{RF}$ 22 (also of bandwidth $IF_{BW}$) lie on either side of the local oscillator signal $F_{LO}$ 23 at a distance $F_{IF}$ from the local oscillator frequency $F_{LO}$. The RF image filters 3, 5 are adapted to exclude all signals outside the range indicated by dotted line 24.

In general, a conventional superheterodyne receiver 1 would be used when the wanted RF signal characteristics are known e.g. frequency, bandwidth, modulation etc. Where no prior knowledge of the RF signal characteristics exists, such as when sweeping for bugging devices, a harmonic receiver topology can be implemented to efficiently and rapidly scan for unknown signals.

A typical harmonic receiver topology is shown in FIG. 3. In the harmonic receiver 30, a local oscillator 32 of frequency $F_{LO}$ is fed via a non-linear junction 33 to a mixer 34, together with an incoming RF signal from an antenna 31, in order to convert the incoming RF signal to an intermediate frequency signal 35 of frequency $F_{IF}$. The intermediate frequency signal 35 is fed to an IF filter 36.

The relationship given in relationship (1) above also applies to the harmonic receiver 30. However, unlike the conventional superheterodyne receiver, the local oscillator 32 harmonic order is not fixed at 1. The non-linear junction 33 used in the harmonic receiver 30 generates at its output 37 a comb of frequencies $n \times F_{LO}$ spaced at harmonics of the local oscillator frequency, $F_{LO}$. The harmonic receiver can therefore monitor a number of frequencies simultaneously $$N_{mon} = ENB = n_{max} \times IF_{BW} \times 2 \quad (3)$$

where $N_{mon}$ is the number of frequencies simultaneously monitored, ENB is the effective noise bandwidth of the harmonic receiver (Hz), $n_{max}$ is the highest order local oscillator harmonic generated by the non-linear junction, $IF_{BW}$ is the final IF bandwidth (Hz) and the multiplication factor of two takes account of the wanted and image responses. Note, however, that the concept of a wanted and image response is not valid for a counter surveillance harmonic receiver as both signals are potentially wanted.

The sensitivity of the typical harmonic receiver is given by the following relationship $$P_{sens(dBm)} = -174 + 10\log_{10}(ENB) + F + CNR \quad (4)$$

where -174 is the thermal noise measured in a 1 Hz bandwidth (dBm), ENB is the effective noise bandwidth of the harmonic receiver (Hz), F is the noise figure of the receiver (dB) and CNR is the required carrier to noise ratio for the desired receiver response (dB). The relationship given in (4) only considers internal receiver noise.

The input frequency plan 40 for the harmonic receiver 30 is shown in FIG. 4. It will be noted that the wanted input signals $F_{RF}$ 41, 42 (each of bandwidth $IF_{BW}$) lie on either side of the local oscillator signal $F_{LO}$ 43, and each harmonic thereof.

In a conventional harmonic counter-surveillance receiver, the technique of "swept compression" scanning is used, which involves sweeping the local oscillator 32 frequency $F_{LO}$ of the harmonic receiver 30. When using a swept compression scanning mode, the number of frequencies that can be simultaneously monitored remains as given in relationship (3) and the sensitivity remains as given in relationship (4).

A feature of swept compression scanning is that as the local oscillator is swept, a single RF input signal can result in numerous responses in the intermediate frequency. This can make signal analysis very difficult. The number of responses can be approximated using the relationship $$N_{resp} \approx [\text{trunc}((F_{RF}-F_{IF})/F_{LO(min)})-\text{round}((F_{RF}-F_{IF})/F_{LO(max)})] + [\text{trunc}((F_{RF}+F_{IF})/F_{LO(min)})-\text{round}((F_{RF}+F_{IF})/F_{LO(max)})]+2 \quad (5)$$

where $N_{resp}$ is the number of responses, trunc(X) rounds X down to the nearest integer, round(X) rounds X up to the nearest integer, $F_{LO(min)}$ is the minimum local oscillator sweep frequency and $F_{LO(max)}$ is the maximum local oscillator sweep frequency. This relationship assumes that the RF signal is a single tone, the IF bandwidth is infinitely small and the sweep resolution is infinitely small.

Using the above swept compression scanning technique, it is possible to calculate the actual RF input frequency from a given multiple response 'fingerprint'. However this is a difficult task when a number of RF signals are received during a swept compression scan, as would typically be the case when searching for bugging devices in a noisy environment.

Another effect of swept compression scanning is that of displayed bandwidth distortion. The maximum displayed bandwidth when using swept compression scanning can be approximated using the relationship $$BW_{disp(max)} = BW_{RF}/N_{min} \quad (6)$$

where $BW_{disp(max)}$ is the maximum displayed bandwidth of the RF signal during a swept compression scan, $BW_{RF}$ is the actual RF signal bandwidth and $N_{min}$ is the lowest order local oscillator harmonic capable of converting the RF signal to the intermediate frequency. The above relationship assumes that the IF bandwidth<<RF signal bandwidth.

$$N_{min} = \text{round}[(F_{RF}-F_{IF}-0.5\times(BW_{RF}))/F_{LO(max)}] \quad (7)$$

Essentially, as the frequency of the RF signal increases, so does the displayed bandwidth error of any of the multiple swept compression responses.

Swept compression scanning is an adequate method for obtaining a signature of the RF spectrum. However, as has been discussed, RF signal analysis when using this scanning mode can become a non-trivial exercise.

It is an object of the present invention to provide an improved scanning method and apparatus for enabling rapid scanning of the RF spectrum to identify transmitters of unknown characteristics such as frequency and bandwidth. It is a further object of the present invention to provide a method and apparatus for generating a fingerprint of an RF spectrum which can more readily be analysed for the identification of unknown radiation sources. It is a further object of the invention to overcome the problem associated with swept compression scanning in which each input signal frequency may generate numerous responses in the intermediate frequency. It is a further object of the invention to overcome the problem of displayed bandwidth distortion.

According to one aspect, the present invention provides a receiver for analysing one or more input signals, comprising a first stage including an input for receiving an RF signal for analysis, a first local oscillator having an output comprising a first plurality of frequencies, a first mixer for combining said signal input and said local oscillator output to generate a first intermediate frequency spectrum output;

a second stage including a second local oscillator adapted to produce as output a sweep signal traversing a second plurality of frequencies, a second mixer for combining said second local oscillator output with said first intermediate frequency output to generate a second intermediate frequency output.

According to another aspect, the present invention provides a receiver for analysing one or more input signals, comprising a first stage including:

an input for receiving an input signal for analysis, means for dividing the input signal spectrum into a plurality of frequency bands, means for superposing signals in each of said frequency bands to form a first intermediate frequency spectrum output;

said receiver further comprising a second stage including:

means for scanning said first intermediate frequency spectrum output to identify peaks therein.

According to another aspect, the present invention provides a method of operating a receiver for analysing one or more input signals, comprising the steps of:

receiving one or more input signals;

dividing the input signal spectrum into a plurality of frequency bands;

superposing signals in each of said frequency bands to form a first intermediate frequency spectrum output;

scanning said first intermediate frequency spectrum output to identify peaks therein.

Embodiments of the present invention will now be described by way of example and with reference to the accompanying drawings in which.

Figure 5:
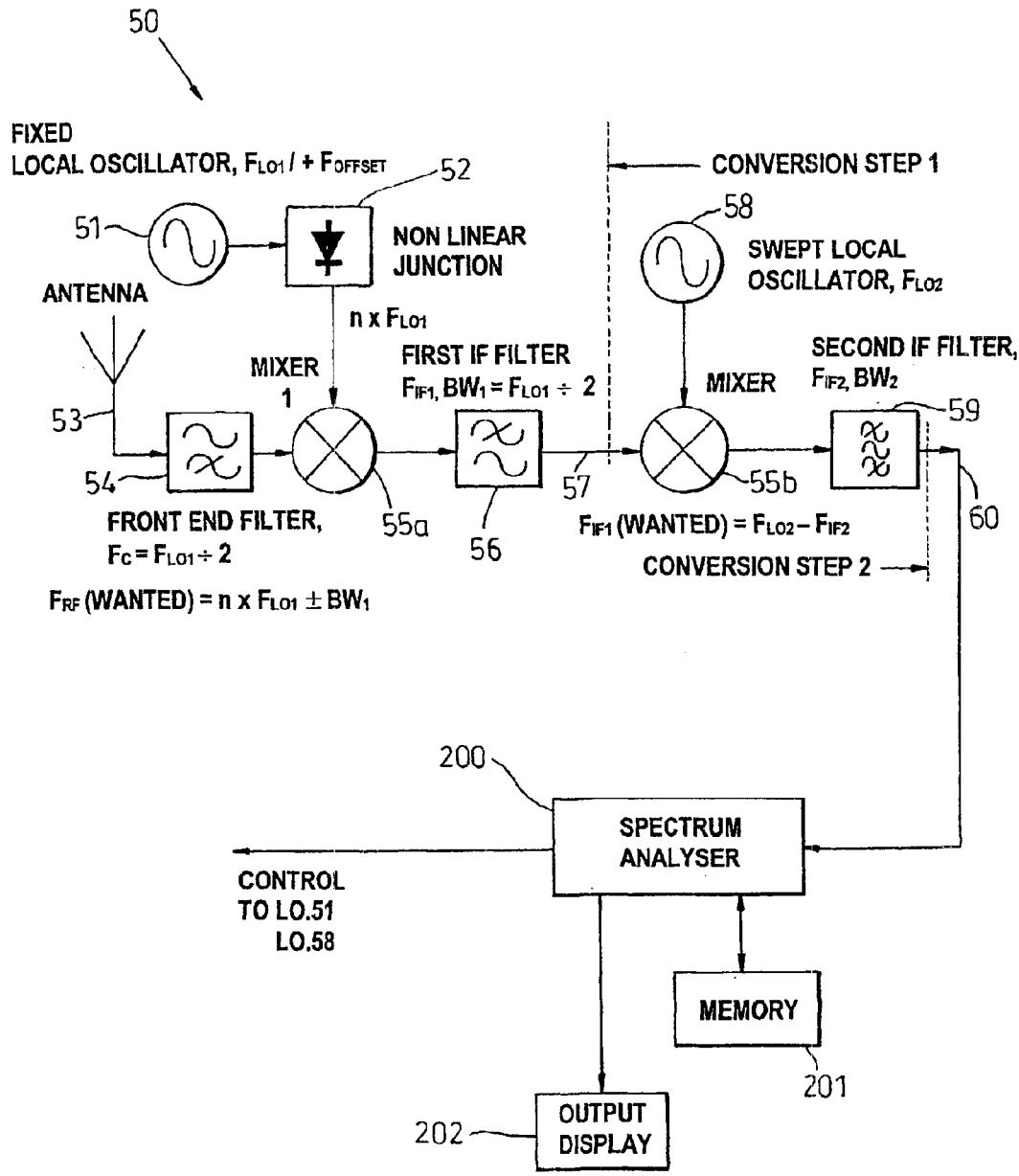
FIG. 5 shows a schematic block diagram of a fixed compression scanning receiver according to an embodiment of the present invention.

FIGS. 1 to 4 have already been discussed in detail in connection with a description of the prior art. With reference to FIG. 5, a scanning apparatus according to a preferred embodiment of the present invention is now described. The present invention uses a fixed compression scan mode in which a fixed local oscillator is fed, via a non-linear junction, to a mixer in order to convert an entire incoming RF spectrum to a first wide band intermediate frequency.

This first wide band IF is then swept using a superheterodyne receiver stage to convert the compressed wide band IF to a second narrow band IF.

Figure 1:
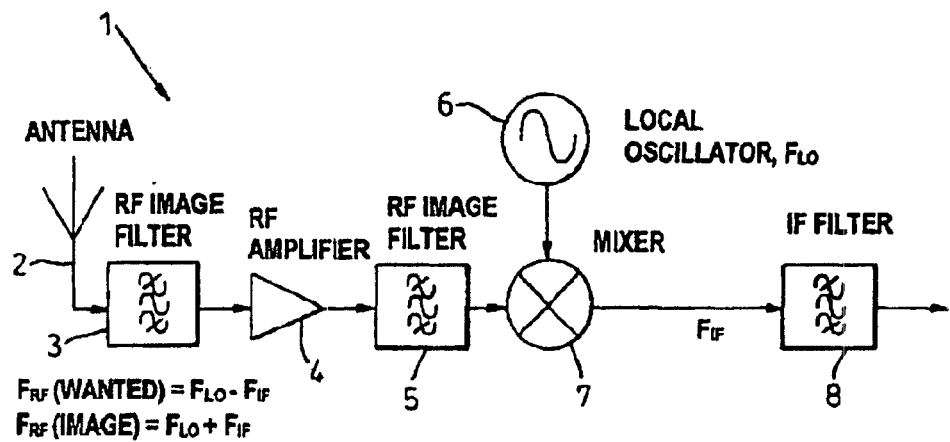
FIG. 1 shows a schematic block diagram of a conventional superheterodyne receiver.
Figure 2:
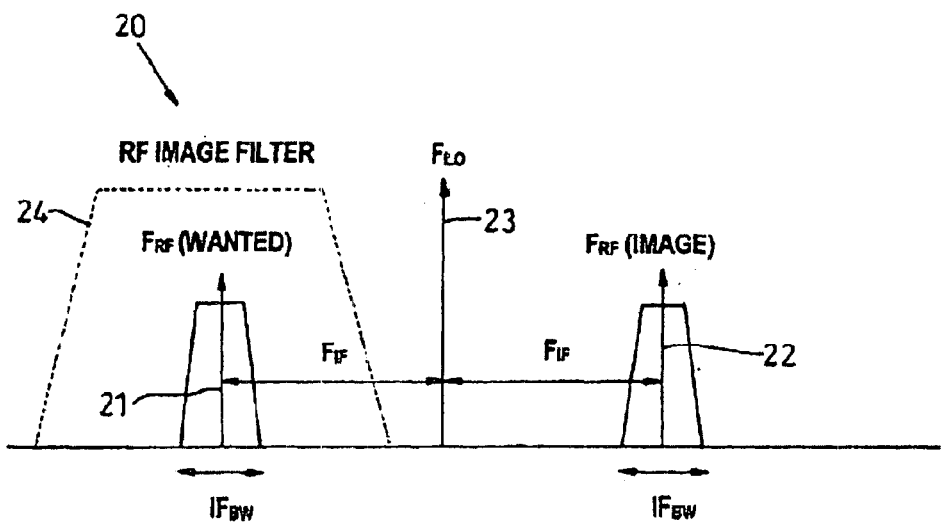
FIG. 2 shows in graphical form an input frequency plan for the conventional superheterodyne receiver of FIG. 2.
Figure 3:
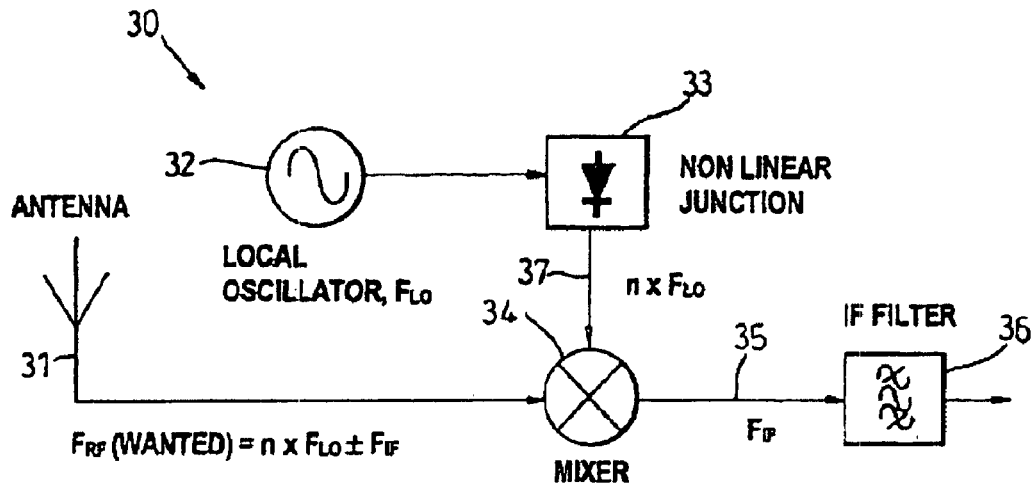
FIG. 3 shows a schematic block diagram of a conventional harmonic receiver.
Figure 4:
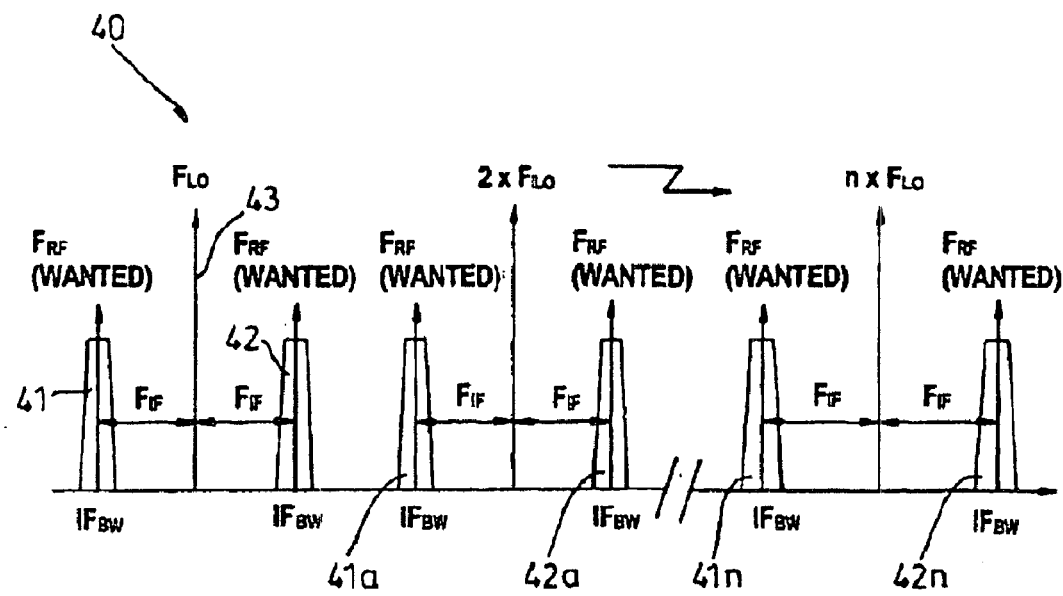
FIG. 4 shows in graphical form an input frequency plan for the conventional harmonic receiver of FIG. 3.

In the "fixed compression" scanning technique of the present invention, a modified form of harmonic receiver 30 and swept superheterodyne receiver are used to form a fixed compression scanning receiver 50. A fixed local oscillator 51 generates a signal $F_{LO1}$. The oscillator 51 is also adapted to be capable of adjusting the generated signal frequency by a predetermined offset $F_{offset}$ to be described hereinafter. The local oscillator 51 output signal $F_{LO1}$ is fed to a non-linear junction 52 which generates as output a comb of frequencies $n \times F_{LO1}$ for feeding to a first mixer 55a. An antenna 53 supplies an input RF signal or signals to a front end high pass filter 54 adapted to pass frequencies above $F_{LO1}/2$. The output of filter 54 is mixed with the output of non-linear junction 52 in the first mixer 55a to generate a first intermediate frequency signal $F_{IF1}$. A first intermediate frequency filter 56 acts as a low pass filter to pass only frequencies in the range $F_{IF1}$ over a bandwidth $BW_1=F_{LO1}/2$. This comprises the first stage of the fixed compression mode receiver 50, providing the first intermediate frequency $F_{IF1}$ at first stage output 57. An important difference between this first stage and the conventional scanning harmonic receivers discussed in connection with FIG. 3 is that a single frequency signal input will result only in a single frequency response in the first intermediate frequency output.

This first stage output 57 in essence comprises a condensed and shifted form of the input signal in which the input signal spectrum has been divided into a plurality of frequency bands, and those bands have superimposed or folded into a first intermediate frequency spectrum output.

The second stage of the fixed compression mode receiver 50 comprises a swept local oscillator 58 which generates a varying signal of frequency $F_{LO2}$ adapted to sweep through a desired range. The output of swept local oscillator 58 is combined with first stage output 57 in a second mixer 55b. The output of the second mixer 55b provides the second intermediate frequency, $F_{IF2}$. This is provided as input to a second intermediate frequency filter 59 comprising a band-pass filter having bandwidth $BW_2$, which then provides the receiver output 60. This output is preferably passed to a spectrum analyser 200 including a memory 201 and output display 202, to be described hereinafter.

When using the fixed compression scan mode the number of frequencies that can be simultaneously monitored remains as given in relationship (3) above, and the sensitivity remains as given in relationship (4) above. A feature of the fixed compression scanning mode is that as the second local oscillator 58 is swept, a single frequency RF input signal will result in a single response in the second intermediate frequency.

The actual frequency of the RF signal input can be measured by offsetting the fixed local oscillator 51 by a predetermined small amount, $F_{offset}$, and measuring the resultant shift in the first intermediate frequency signal output 60. The frequency can be calculated using the relationship If $F_{IF1(a)}-F_{IF1(b)}$ is positive, [low side LO], then $$F_{RF}=\text{mod}[(F_{IF1(a)}-F_{IF1(b)})/F_{offset}] \times F_{LO1}+F_{IF1(a)} \qquad (8)$$

If $F_{IF1(a)}-F_{IF1(b)}$ is negative, [high side LO], then $$F_{RF}=\text{mod}[(F_{IF1(a)}-F_{IF1(b)})/F_{offset}] \times F_{LO1}-F_{IF1(a)} \qquad (9)$$

where mod[X] returns the magnitude of X, $F_{IF1(a)}$ is the first IF at $F_{LO1}$ and $F_{IF1(b)}$ is the first IF at $(F_{LO1}+F_{offset})$ The fixed compression scanning receiver 50 can also be used to analyse the RF signal bandwidth. The displayed signal bandwidth when using fixed compression scanning can be approximated using the relationship $$BW_{disp} \approx BW_{RF(signal)} \qquad (10)$$

where $BW_{disp}$ is the signal bandwidth indicated on the spectral display output and $BW_{RF(signal)}$ is the actual RF signal bandwidth. Relationship (10) assumes that the IF bandwidth, $BW_2$ <<RF signal bandwidth.

A further feature of the fixed compression scanning mode is that the scan resolution chosen for the sweeping the first intermediate frequency translates directly to scan resolution in the RF spectrum.

$$\text{Scan}_{IF1(res)}=\text{Scan}_{RF(res)} \qquad (11)$$

where $\text{Scan}_{IF1(res)}$ is the sweep resolution of the first IF bandwidth, $BW_1$, and $\text{Scan}_{RF(res)}$ is the sweep resolution of the entire RF spectrum. As the first IF bandwidth, $BW_1$, is considerably smaller than the RF spectrum, the entire RF spectrum can be rapidly scanned. The potential increase in scan rate over a conventional superheterodyne receiver can be approximated using the relationship $$\text{Scan}_{RI} \approx (2 \times BW_{RF})/F_{LO1} \qquad (12)$$

where $\text{Scan}_{RI}$ is the scan rate increase relative to a conventional superheterodyne receiver scanning at the same resolution, $BW_{RF}$ is the entire RF spectrum bandwidth captured by the receiver and the multiplication factor of two takes account of wanted and image responses.

Figure 6:
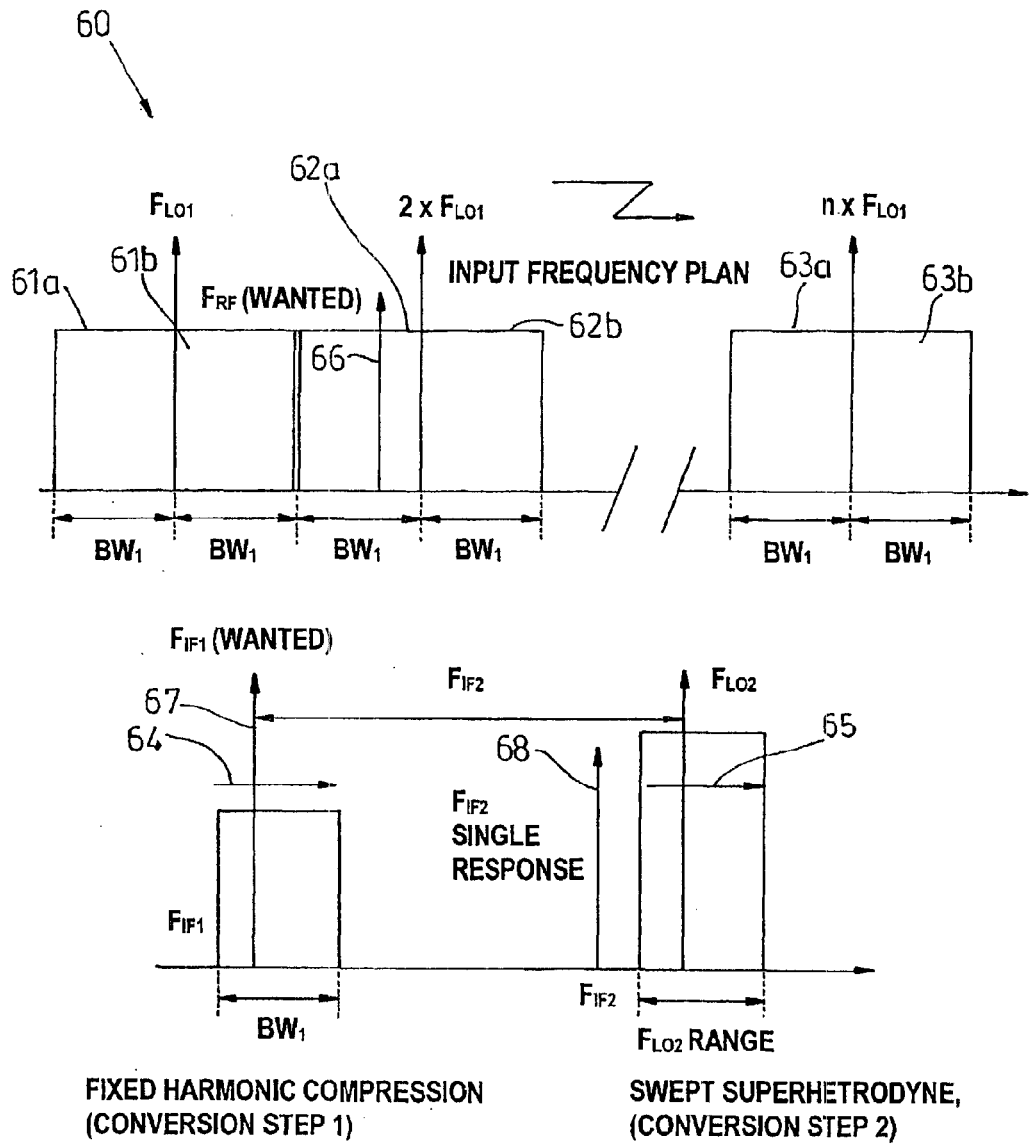
FIG. 6 shows in graphical form a frequency plan for the fixed compression mode scanning receiver of FIG. 5.

The input frequency plan for the fixed compression mode receiver 50, also showing a single RF input signal is shown in FIG. 6. In FIG. 6, the local oscillator 51 and non-linear junction 52 provide the frequencies $F_{LO1}, 2F_{LO1}, \ldots nF_{LO1}$. The RF input signal is mixed with these frequencies to effectively partition the spectrum into frequency bands 61a, 61b, 62a, 62b, 63a and 63b corresponding to $F_{LO1} \pm BW_1$, $2F_{LO1} \pm BW_1, \ldots nF_{LO1} \pm BW_1$. Each of the frequency bands 61a ... 63b are then superimposed on one another to form the compressed band, $F_{IF1}$, of bandwidth BW1 (see "conversion step 1") in the graph below. In the second stage, the superimposed signals are converted to the second intermediate frequency, $F_{IF2}$, using the variable local oscillator 58 of frequency $F_{LO2}$, over the range indicated by arrow 65. The exemplary unknown signal $F_{RF(wanted)}$ 66 as shown within the IF band 62a will appear at 67 in the compressed spectrum 64 at intermediate frequency $F_{IF1(wanted)}$ after the first stage, fixed compression. It will then appear as a single response 68 at intermediate frequency $F_{IF2}$ after swept superheterodyne conversion over the range of $F_{LO2}$.

Referring again to FIG. 5, it will be understood that various changes may be made to the fixed compression receiver 50 without departing from the principles of the present invention. For example, the comb of frequencies $n \times F_{LO1}$ supplied to mixer 55a need not necessarily be a harmonic series. More generally, a plurality of frequencies are input to the mixer 55a, providing that, during the sweep of the intermediate frequency spectrum output 57 and subsequent analysis, account is taken of the particular of frequencies used. In this arrangement, the fixed local oscillator 51 and non-linear junction 52 might be replaced by a set of fixed local oscillators each operating at a specific different frequency.

In another embodiment, the front end filter 54 and first intermediate frequency filters might be modified or omitted, although this may compromise performance by allowing through unwanted harmonics and a worsening of signal to noise ratio.

Figure 7:
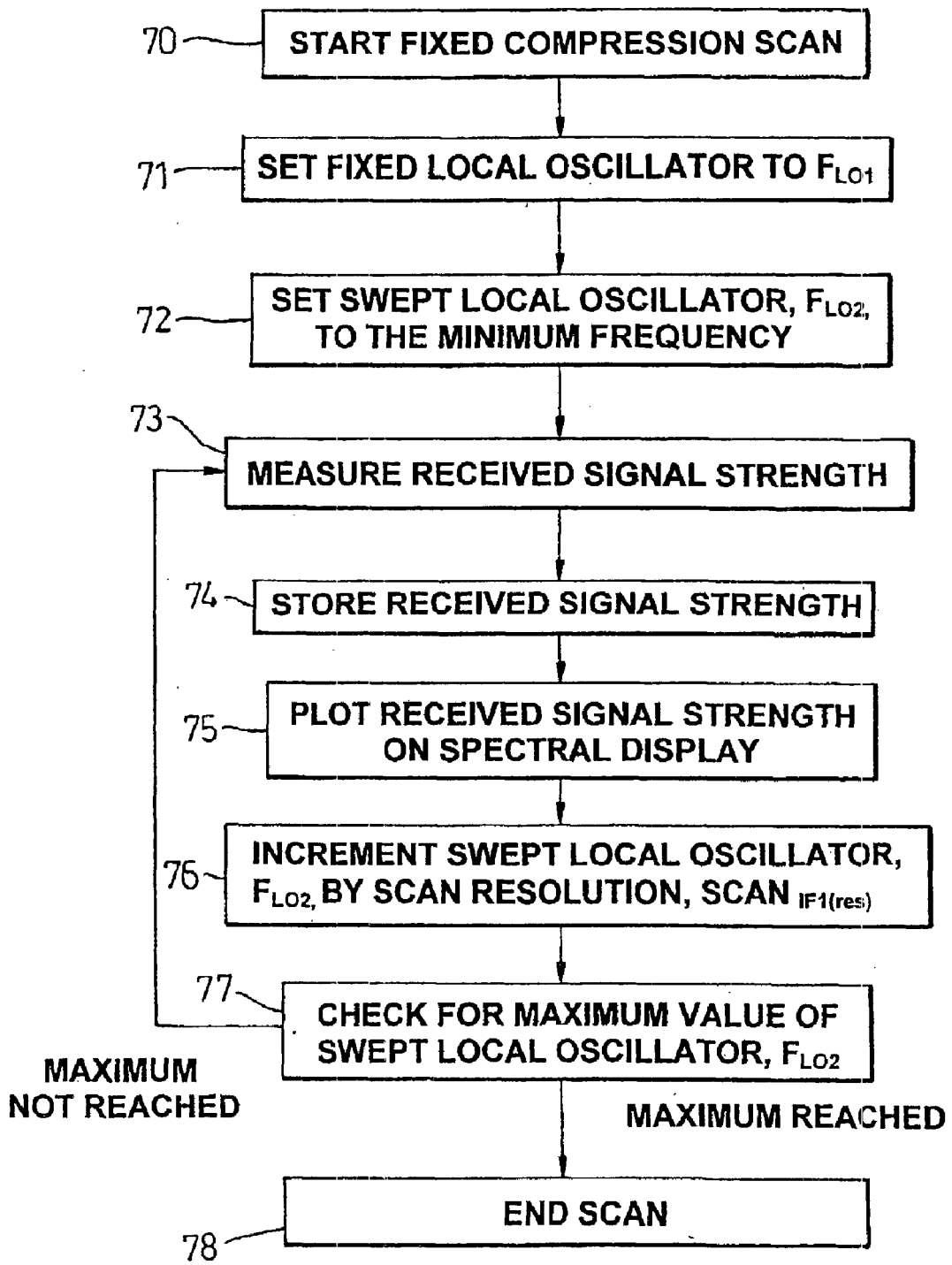
FIG. 7 shows a flowchart of steps for performing a fixed compression scan using the receiver of FIG. 5.

With reference to FIG. 7, there is described a mode of use of the fixed compression scanning receiver 50. The control of receiver 50 starts at box 70. The fixed local oscillator 51 is set to frequency $F_{LO1}$ (box 71), for example 20 MHz. The swept local oscillator 58 is set to its minimum frequency (box 72), for example 10.7 MHz. The signal strength on receiver output 60 is then measured (box 73), stored in memory 201 (box 74) and plotted on display device 202 (box 75). The swept local oscillator frequency 58 is then incremented one step of its scan resolution, $Scan_{IF1(res)}$ (box 76), for example 1 kHz. A check is made to see whether a maximum value of the swept local oscillator has been reached (box 77), for example 20.7 MHz. If not, the measurement, storage, plotting and incrementing cycle is repeated (steps 75 to 76). If the maximum frequency of the swept local oscillator 58 has been reached, the swept scan is completed and the scan ended (box 78).

Figure 8A:
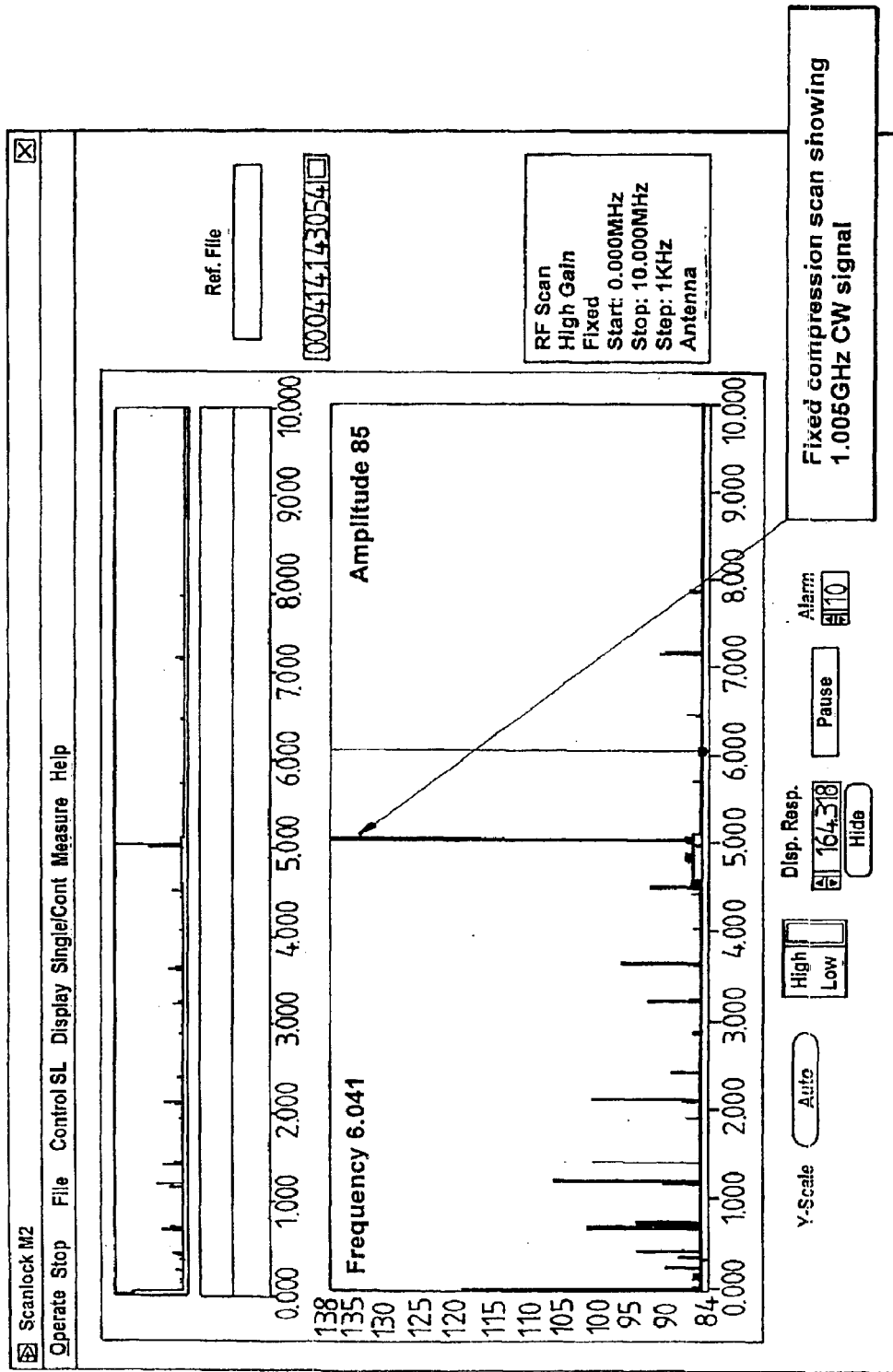
FIGS. 8a and 8b show spectrum analysis outputs of the receiver of FIG. 5.
Figure 8B:
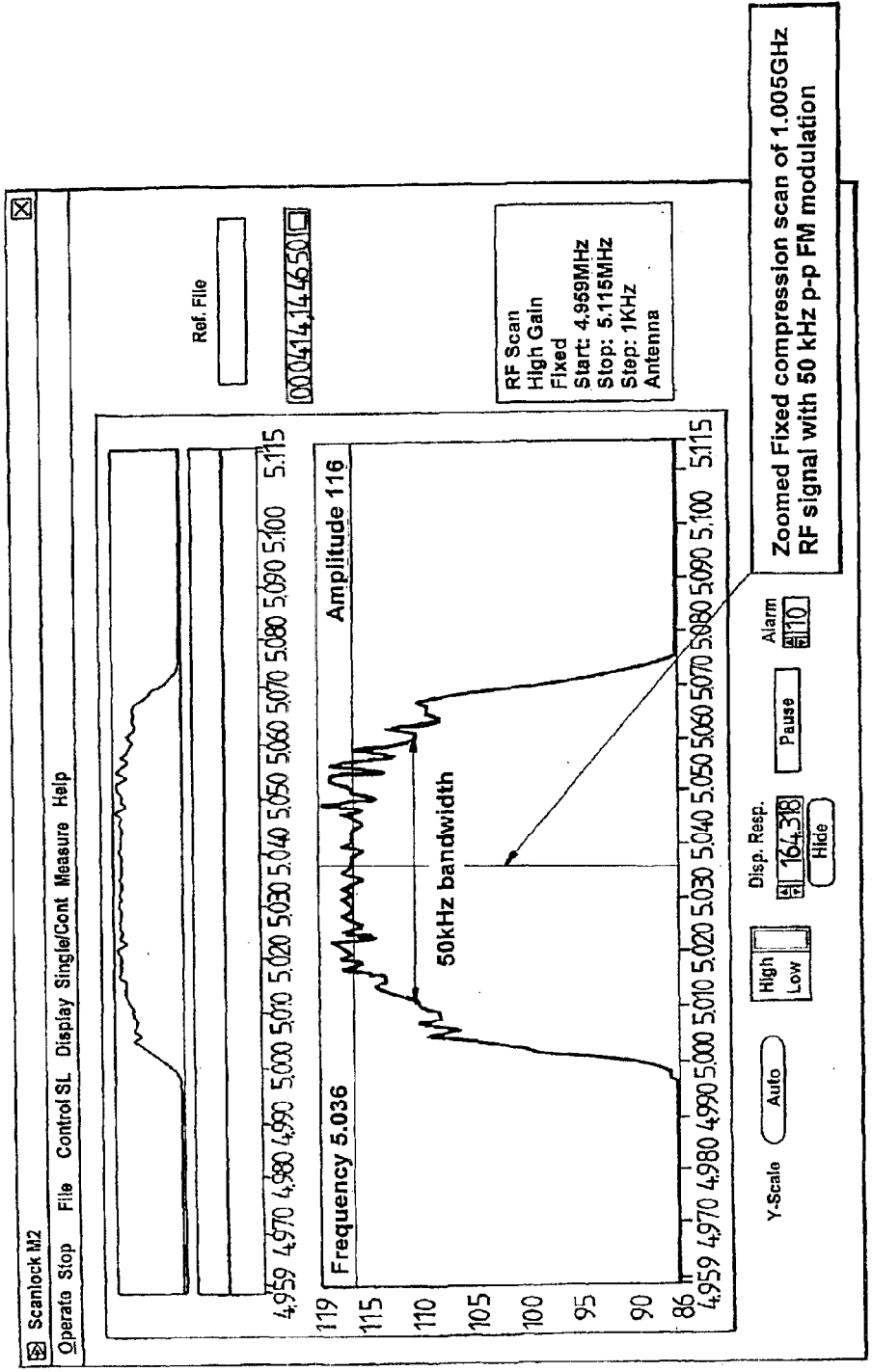

An exemplary output of scan on display device 202 is shown in FIG. 8a, which plots receiver output 60 over the swept scan showing an RF input signal detected at 5 MHz from one of the fixed oscillator harmonics (in the present case, in fact a 1.005 GHz input signal detected, to be determined later). The swept scan is carried out for intermediate frequency band zero to 10 MHz, with sweep increment intervals of 1 kHz. FIG. 8b shows a "zoomed in" scan corresponding to FIG. 8a, between 4.959 MHz and 5.115 MHz for spectrum analysis. Such an analysis is possible because of the one to one relationship between the RF signal input and the intermediate frequency output.

Figure 9:
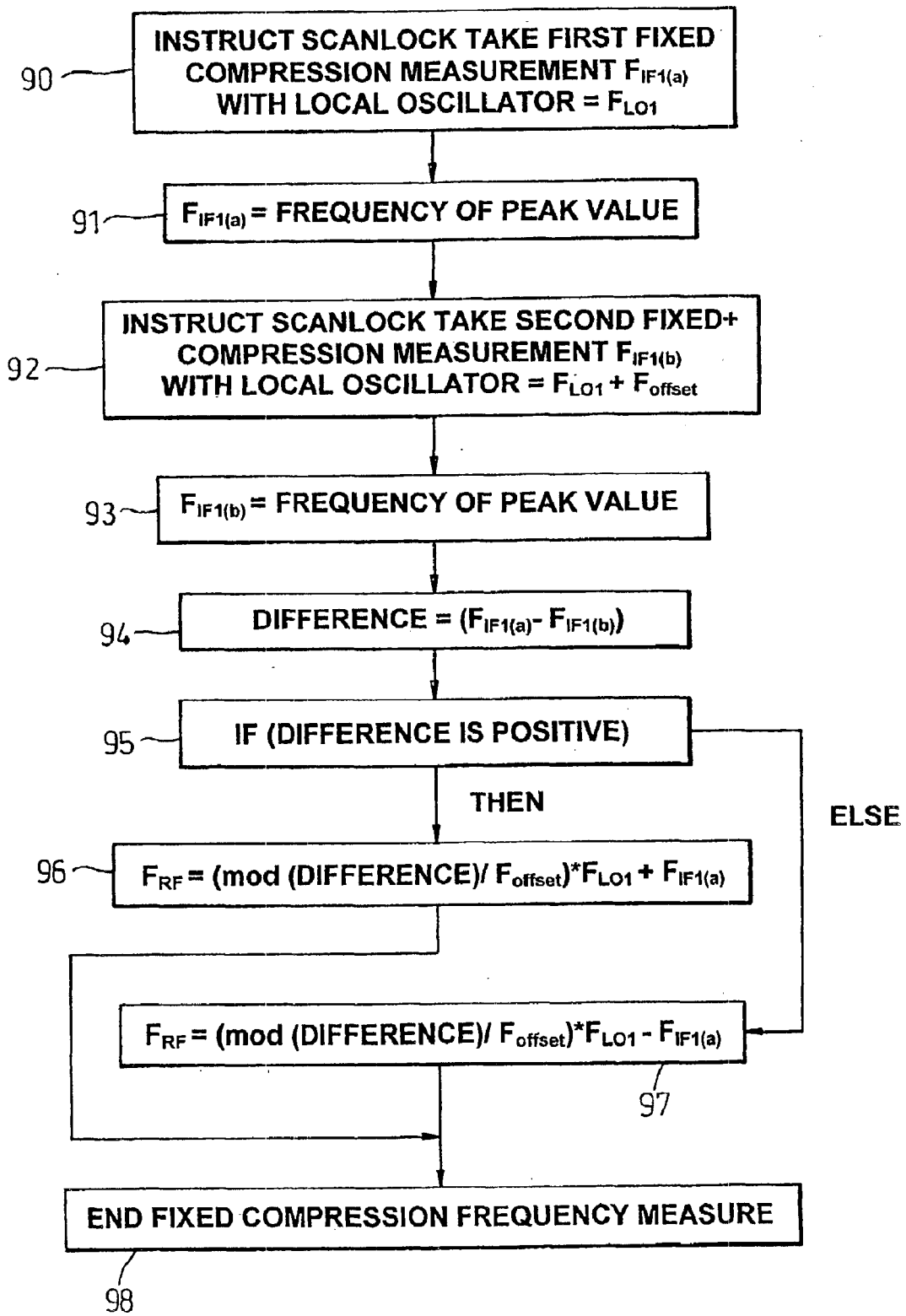
FIG. 9 shows a flowchart of steps for performing a frequency measurement using the receiver of FIG. 5.

With reference to FIG. 9, there is described the steps carried out by spectrum analyser 200 of the fixed compression scanning receiver 50 to determine the absolute frequency of a detected signal. The receiver first takes a fixed compression measurement $F_{IF1(a)}$ with the local oscillator at frequency $F_{LO1}$ (step 90). The frequency of a peak value detected $F_{IF1(a)}$ in the fixed compression spectrum output 57 is determined (step 91). The receiver then takes a second fixed compression measurement with the local oscillator at frequency $F_{LO1}+F_{offset}$ (box 92). The frequency of the peak value detected has now moved to $F_{IF1(b)}$ (box 93). The difference is calculated (box 95) and the frequency of the input signal $F_{RF}$ is determined for a positive difference value (boxes 95 and 96) or for a negative difference value (boxes 95 and 97).

Figure 10:
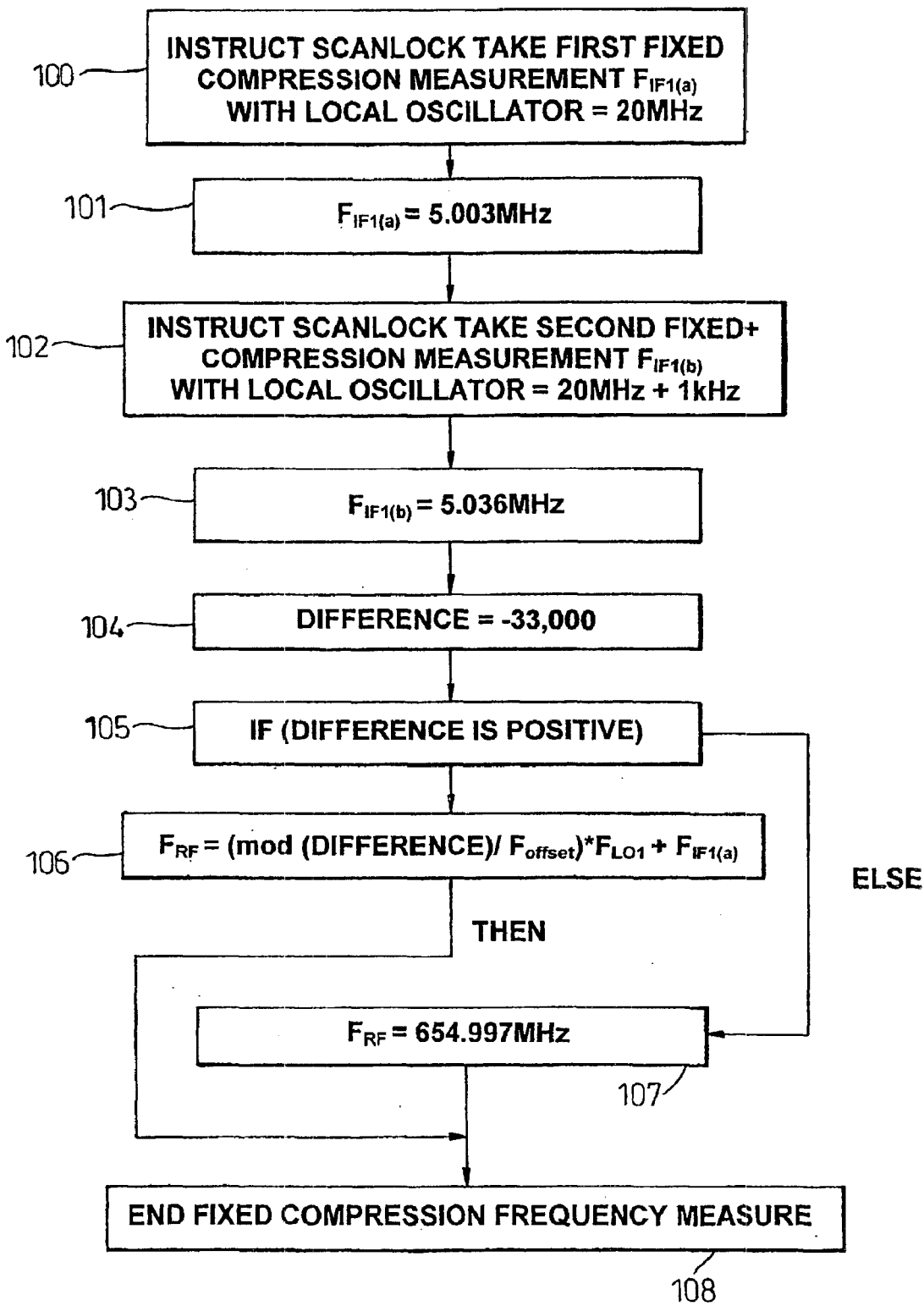
FIG. 10 shows a flowchart illustrating a specific example of the steps of FIG. 9.

FIG. 10 shows a flowchart corresponding to that of FIG. 9 in which exemplary data are inserted. The initial fixed compression measurement is taken at local oscillator frequency 20 MHz. The first fixed compression measurement $F_{IF1(a)}$ gives a peak at 5.003 MHz. The second fixed compression measurement is taken at local oscillator frequency shifted to 20.001 MHz. The first fixed compression measurement $F_{IF1(b)}$ gives a peak at 5.036 MHz. The difference is −33 kHz, the (negative) difference giving an input signal frequency $F_{RF}$=654.997 MHz.

Figure 11:
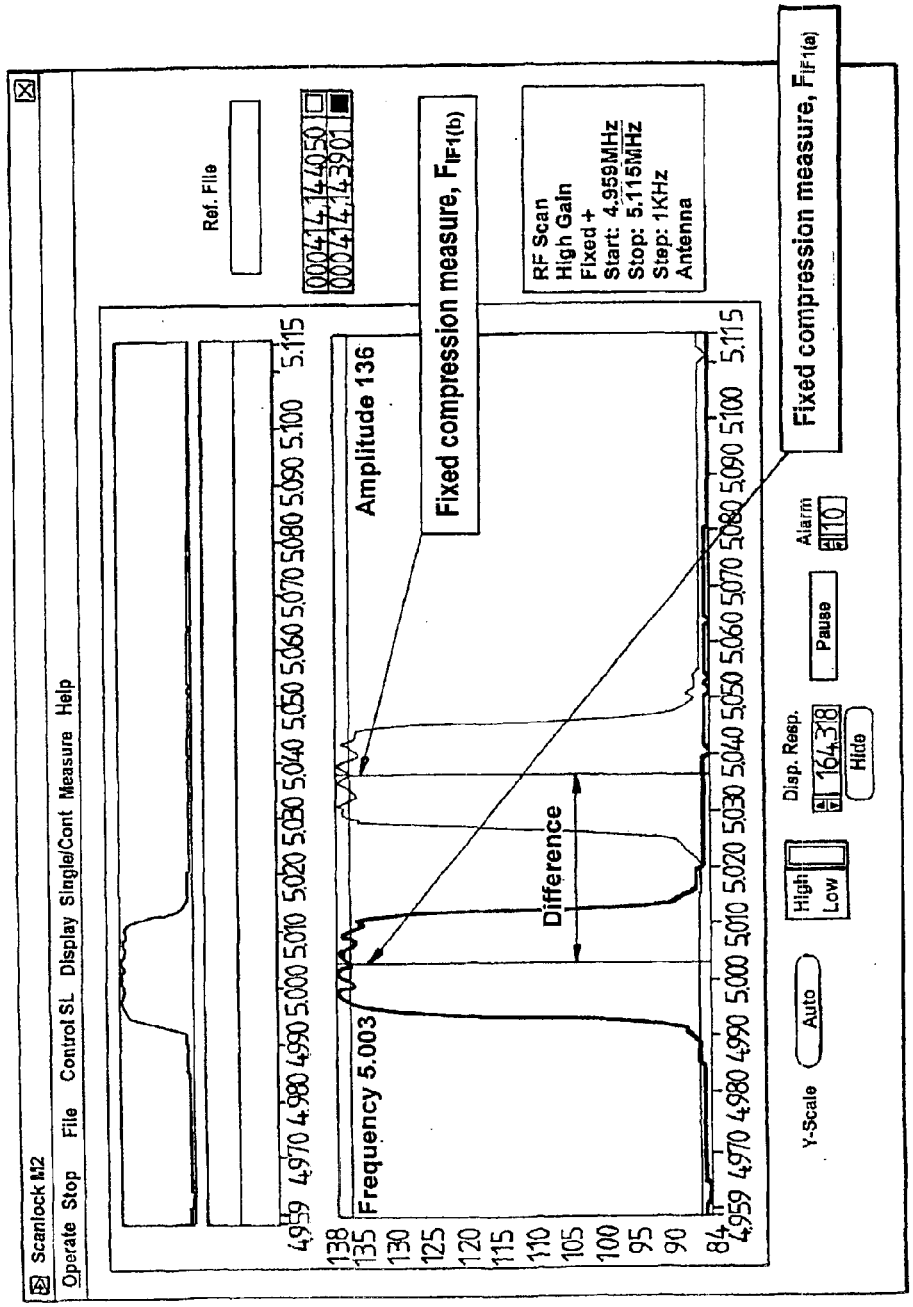
FIG. 11 shows a graphical output display of the results of the steps of FIG. 10.

FIG. 11 shows a graphical display output of the results from the method as described in connection with FIGS. 9 and 10.

The present invention has been described with reference to certain specific embodiments as depicted in the drawings which are not intended to be in any way limiting. Variations to the embodiments described are within the scope of the appended claims.

What is claimed is:

1. A receiver for analyzing one or more input signals, comprising
a first stage including an input for receiving an RF signal for analysis, a first local oscillator having an output comprising a first plurality of frequencies such that there are multiple frequencies present on the output at the same time, a first mixer for combining said signal input and said local oscillator output to generate a first intermediate frequency spectrum output;
a second stage including a second local oscillator adapted to produce as output a sweep signal traversing a second plurality of frequencies, a second mixer for combining said second local oscillator output with said first intermediate frequency output to generate a second intermediate frequency output.

2. A receiver according to claim 1 wherein said first local oscillator comprises a fixed oscillator having a first frequency, passed through a non-linear junction to generate said first plurality of frequencies as a harmonic series.

3. A receiver according to claim 1 wherein said first stage further includes a front end filter between said input and said first mixer, said front end filter adapted to block frequencies less than half the fundamental frequency of the first local oscillator.

4. A receiver according to claim 1 wherein said first stage further includes an intermediate frequency filter.

5. A receiver according to claim 1 further including recording means for recording said second intermediate frequency output for each one of said second plurality of frequencies.

6. A receiver according to claim 5 wherein said first stage further includes means for shifting said first plurality of frequencies by a predetermined offset value.

7. A receiver according to claim 6 further including input frequency determination means for determining the frequency of an input signal by:
identifying a peak in the first intermediate frequency output for a first scan in which the first local oscillator generates said first plurality of frequencies;
identifying a corresponding peak in the first intermediate frequency output for a second scan in which the first local oscillator generates a shifted plurality of frequencies; and
measuring the frequency shift between the peaks for the first and second scans.

8. A receiver for analyzing one or more input signals, comprising a first stage including:
an input for receiving an input signal for analysis,
means for dividing the input signal spectrum into a plurality of frequency bands such that there are multiple frequency bands present at the same time,
means for superposing signals in each of said frequency bands to form a first intermediate frequency spectrum output;
said receiver further comprising a second stage including:
means for scanning said first intermediate frequency spectrum output to identify peaks therein.

9. A receiver according to claim 8 in which the means for dividing and the means for superposing comprise a first local oscillator having an output comprising a first plurality of frequencies, a first mixer for combining said signal input and said local oscillator output to generate said first intermediate frequency spectrum output.

10. A receiver according to claim 9 in which the means for scanning comprises a second local oscillator adapted to produce as output a sweep signal traversing a second plurality of frequencies, a second mixer for combining said second local oscillator output with said first intermediate frequency output to generate a second intermediate frequency output.

11. A receiver according to claim 10 wherein said first local oscillator includes means for shifting said first plurality of frequencies by a predetermined offset value.

12. A receiver according to claim 8, wherein the means for dividing the input signal spectrum into a plurality of frequency bands comprise:

means for converting the entire incoming signal spectrum to a first wide band intermediate frequency having a plurality of frequency bands.

13. A method of operating a receiver for analyzing one or more input signals, comprising the steps of:

receiving one or more input signals;

dividing the input signal spectrum into a plurality of frequency bands such that there are multiple frequency bands present at the same time;

superposing signals in each of said frequency bands to form a first intermediate frequency spectrum output;

scanning said first intermediate frequency spectrum output to identify peaks therein.

14. A method according to claim 13 wherein said steps of dividing and superposing comprise combining the output of a first local oscillator having a first plurality of first local oscillator frequencies with the input signal, to generate a first stage intermediate frequency spectrum output.

15. A method according to claim 14, wherein the first stage intermediate frequency spectrum is designated as an initial first stage intermediate frequency spectrum, and further including the step of shifting the first plurality of first local oscillator frequencies by a predetermined offset value then repeating the steps of claim 13 to generate a further first stage intermediate frequency spectrum output.

16. A method according to claim 15 further including identifying a peak in the initial first intermediate frequency spectrum and identifying a corresponding peak in the further first stage intermediate frequency spectrum output and deducing an input signal frequency from a difference between said peaks.

17. A method according to claim 13 wherein said step of scanning said first intermediate frequency spectrum comprises sequentially combining said first stage intermediate frequency spectrum with each one of a plurality of frequencies to generate a second stage intermediate frequency spectrum output.

18. A method according to claim 17 further including the step of displaying said second stage intermediate frequency spectrum output in graphical form.

19. A computer program product, comprising a computer readable medium having thereon computer program code means adapted, when said program is loaded into a computer-controlled receiver, to make the receiver execute the procedure of any one of claims 13 to 16.

20. A method according to claim 13, wherein dividing the input signal spectrum into a plurality of frequency bands comprises:

converting the entire incoming signal spectrum to a first wide band intermediate frequency having a plurality of frequency bands.

\* \* \* \* \*

UNITED STATES PATENT AND TRADEMARK OFFICE
CERTIFICATE OF CORRECTION

PATENT NO.    : 6,894,475 B2
DATED         : May 17, 2005
INVENTOR(S)   : Andrew Barry Stephen et al.

It is certified that error appears in the above-identified patent and that said Letters Patent is hereby corrected as shown below:

Column 10,
Line 22, replace "claims 13 to 16" with -- claims 13 to 18 --.

Signed and Sealed this

Second Day of August, 2005

JON W. DUDAS
*Director of the United States Patent and Trademark Office*